United States Patent
Ray et al.

(10) Patent No.: US 8,929,052 B2
(45) Date of Patent: *Jan. 6, 2015

(54) METHODS OF PROCESSING SEMICONDUCTOR SUBSTRATES, ELECTROSTATIC CARRIERS FOR RETAINING SUBSTRATES FOR PROCESSING, AND ASSEMBLIES COMPRISING ELECTROSTATIC CARRIERS HAVING SUBSTRATES ELECTROSTATICALLY BONDED THERETO

(71) Applicant: Micron Technology, Inc., Boise, ID (US)

(72) Inventors: Dewali Ray, Boise, ID (US); Warren M. Farnworth, Nampa, ID (US); Kyle K. Kirby, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/921,022

(22) Filed: Jun. 18, 2013

(65) Prior Publication Data

US 2013/0276985 A1 Oct. 24, 2013

Related U.S. Application Data

(60) Continuation of application No. 13/169,915, filed on Jun. 27, 2011, now Pat. No. 8,503,156, which is a division of application No. 11/780,628, filed on Jul. 20, 2007, now Pat. No. 7,989,022.

(51) Int. Cl.
*H01L 21/683* (2006.01)

(52) U.S. Cl.
CPC .................................. *H01L 21/6833* (2013.01)
USPC .......................................... 361/234; 439/426

(58) Field of Classification Search
USPC .......................................... 361/234; 439/426
See application file for complete search history.

(56) References Cited

U.S. PATENT DOCUMENTS 2,858,518 A * 10/1958 Chrystie et al. ............... 439/426
4,499,371 A     2/1985 Rose (Continued)

FOREIGN PATENT DOCUMENTS

WO    WO 2007/059887 A1    5/2007

OTHER PUBLICATIONS

Bock et al., "Characterization of electrostatic carier substrates to be used as a support for thin semiconductor wafers", Fraunhofer Institute for Reliability and Microintegration IZM-M, pp. 1-4, (2005).

(Continued)

*Primary Examiner* — Scott Bauer
(74) *Attorney, Agent, or Firm* — Wells St. John, P.S.

(57) ABSTRACT

A method of processing a substrate includes physically contacting an exposed conductive electrode of an electrostatic carrier with a conductor to electrostatically bond a substrate to the electrostatic carrier. The conductor is removed from physically contacting the exposed conductive electrode. Dielectric material is applied over the conductive electrode. The substrate is treated while it is electrostatically bonded to the electrostatic carrier. In one embodiment, a conductor is forced through dielectric material that is received over a conductive electrode of an electrostatic carrier to physically contact the conductor with the conductive electrode to electrostatically bond a substrate to the electrostatic carrier. After removing the conductor from the dielectric material, the substrate is treated while it is electrostatically bonded to the electrostatic carrier. Electrostatic carriers for retaining substrates for processing, and such assemblies, are also disclosed.

16 Claims, 6 Drawing Sheets

(56) References Cited

U.S. PATENT DOCUMENTS

| | | | |
|---|---|---|---|
| 4,728,300 A * | 3/1988 | Shillito et al. | 439/426 |
| 4,733,632 A | 3/1988 | Ohmi et al. | |
| 5,004,897 A * | 4/1991 | Biggio et al. | 235/441 |
| 5,691,876 A | 11/1997 | Chen et al. | |
| 5,729,423 A | 3/1998 | Donde et al. | |
| 6,921,720 B2 | 7/2005 | Arita et al. | |
| 7,564,672 B2 * | 7/2009 | Retzlaff | 361/234 |
| 7,652,867 B2 | 1/2010 | Retzlaff | |
| 7,667,945 B2 | 2/2010 | Wieland et al. | |
| 8,503,156 B2 * | 8/2013 | Ray et al. | 361/234 |
| 2002/0110449 A1 | 8/2002 | Arlt et al. | |
| 2004/0029432 A1 * | 2/2004 | Denneler et al. | 439/426 |
| 2004/0037692 A1 * | 2/2004 | Landesberger et al. | 414/935 |
| 2004/0055709 A1 | 3/2004 | Boyd et al. | |
| 2007/0258185 A1 | 11/2007 | Retzlaff | |
| 2008/0237819 A1 | 10/2008 | Wieland et al. | |

OTHER PUBLICATIONS

Bock et al., "New Manufacturing Concepts for Ultra-Thin Siilicon Gallium Arsenide Substrates", Fraunhofer Institute for Reliability and Microintegration IZM-M, 2003, pp. 1-4.

* cited by examiner

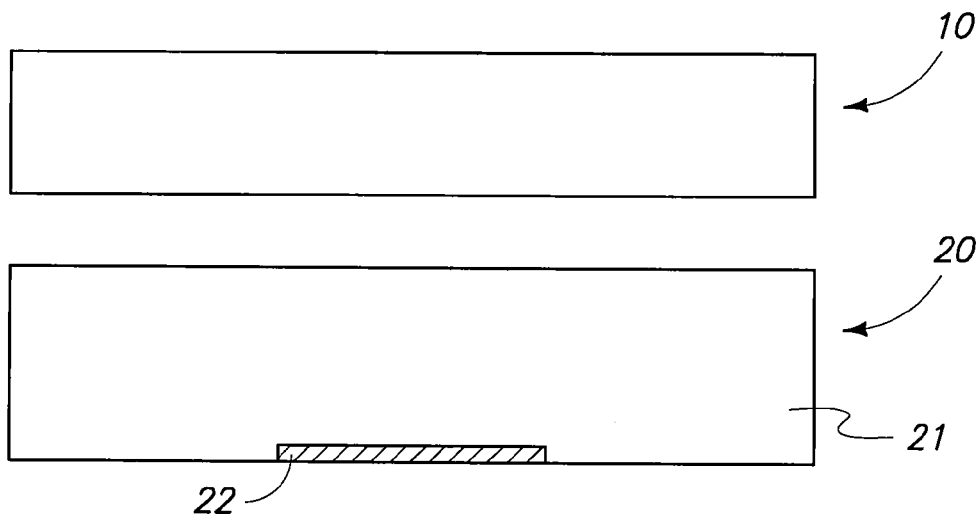
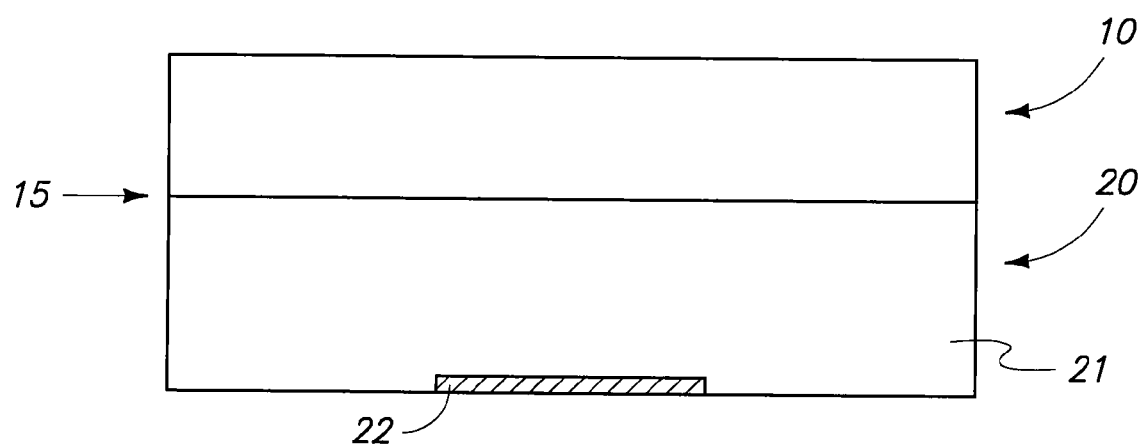

METHODS OF PROCESSING SEMICONDUCTOR SUBSTRATES, ELECTROSTATIC CARRIERS FOR RETAINING SUBSTRATES FOR PROCESSING, AND ASSEMBLIES COMPRISING ELECTROSTATIC CARRIERS HAVING SUBSTRATES ELECTROSTATICALLY BONDED THERETO

RELATED PETENT DATA

This patent resulted from a continuation application of U.S. patent application Ser. No. 13/169,915, filed Jun. 27, 2011, entitled "Methods of Processing Semiconductor Substrates, Electrostatic Carriers for Retaining Substrates for Processing, and Assemblies Comprising Electrostatic Carriers Having Subsrates Electrostatically Bonded Therto", naming Dewali Ray, Warren M Farnworth, And Kyle K Kirby as inventors, which is a divisional application of U.S. patent application Ser. No. 11/780,628, filed Jul. 20,2007, now U.S. Pat. No. 7,989,022, entitled "Methods of Processing Semiconductor Substrates, Electrostatic Carriers for Retaining Substrates for Processing, and Assemblies Comprising electrostatic Carriers Having Substrates Electrostatically Bonded Thereto", naming Dewali Ray, Warren M Farnworth, and Kyle K Kirby as inventors, the disclosures of which are incorporated by refrence.

TECHNICAL FIELD

Embodiments disclosed herein pertain to methods of processing substrates, to electrostatic carriers for retaining substrates, and to assemblies comprising electrostatic carriers having substrates electrostatically bonded thereto.

BACKGROUND

A plurality of integrated circuits is typically fabricated relative to a semiconductor wafer or other semiconductor substrate. The substrate is subjected to various treating steps, such as material growth, deposition, etching, ion implantation, etc., in forming the integrated circuitry. Accordingly, the semiconductor substrate is subjected to a plurality of different treatments prior to completion. Recently, the semiconductor substrates being processed have become increasingly thinner and fragile leading to different techniques for supporting the individual substrates through the various different treatments to which they are subjected.

One manner of supporting such substrates is to adhere individual substrates to a rigid carrier with a temporary adhesive. At the conclusion of all processing, the semiconductor substrate is removed from the rigid carrier which can then be used again to process another semiconductor substrate. Use of such rigid carriers is not, however, without drawbacks. For example, considerable time is spent in preparing the carrier for the adhesive bonding, the actual bonding process itself, and in the de-bonding which also includes cleaning processes with expensive solvents. Further, the temporary adhesives can have poor high temperature stability, and tend to outgas material which can adversely effect the treating of the semiconductor substrate.

Another manner of retaining semiconductor substrates for processing uses electrostatic carriers. Such enable reversible bonding of semiconductor substrates by electrostatic attraction forces which are induced by a near-permanent polarization state of one or more dielectric layers. With electrostatic carriers, a semiconductor substrate is received against a dielectric side of a carrier substrate. The semiconductor substrate is typically provided at a ground potential, and suitable positive voltage is applied to a conductive electrode on the electrostatic carrier to provide a positive/negative electrostatic attraction force at an interface of the semiconductor substrate and electrostatic carrier. The attraction force remains after removal of the external voltage sources, thereby enabling the semiconductor substrate to be treated with various different processing steps. At the conclusion of the various treatments, the electrostatic attraction force can be removed by shorting the electrostatic carrier electrode and semiconductor substrate relative to one another, or by applying a suitable negative voltage to the electrostatic carrier electrode.

Accordingly, the time for bonding and de-bonding is very short in comparison to use of temporary adhesives. Further, electrostatic bonding enables subsequent processing of the semiconductor substrates at very high temperatures without the effects of outgassing, blistering, etc. Further, cleaning of the semiconductor substrate upon de-bonding that is required after de-bond using temporary adhesive technology can be eliminated.

However, commercially available electrostatic carriers are not practically capable of wet immersion processing, for example electroplating, wet etching, and wafer cleaning where the carrier with substrate bonded thereto is typically immersed in an aqueous liquid. This is because an electric path can be created within the liquid from the electrostatic carrier substrate electrode to the semiconductor substrate, thereby removing the electrostatic attraction force and de-bonding the semiconductor substrate from the electrostatic carrier.

BRIEF DESCRIPTION OF THE DRAWINGS

FIG. 1 is a diagrammatic sectional view of a substrate and electrostatic carrier in proximity relative to one another.

FIG. 2 is a diagrammatic sectional view of the substrate and the electrostatic carrier of FIG. 1 in contact with one another.

DETAILED DESCRIPTION OF EXAMPLE EMBODIMENTS

Figure 3:
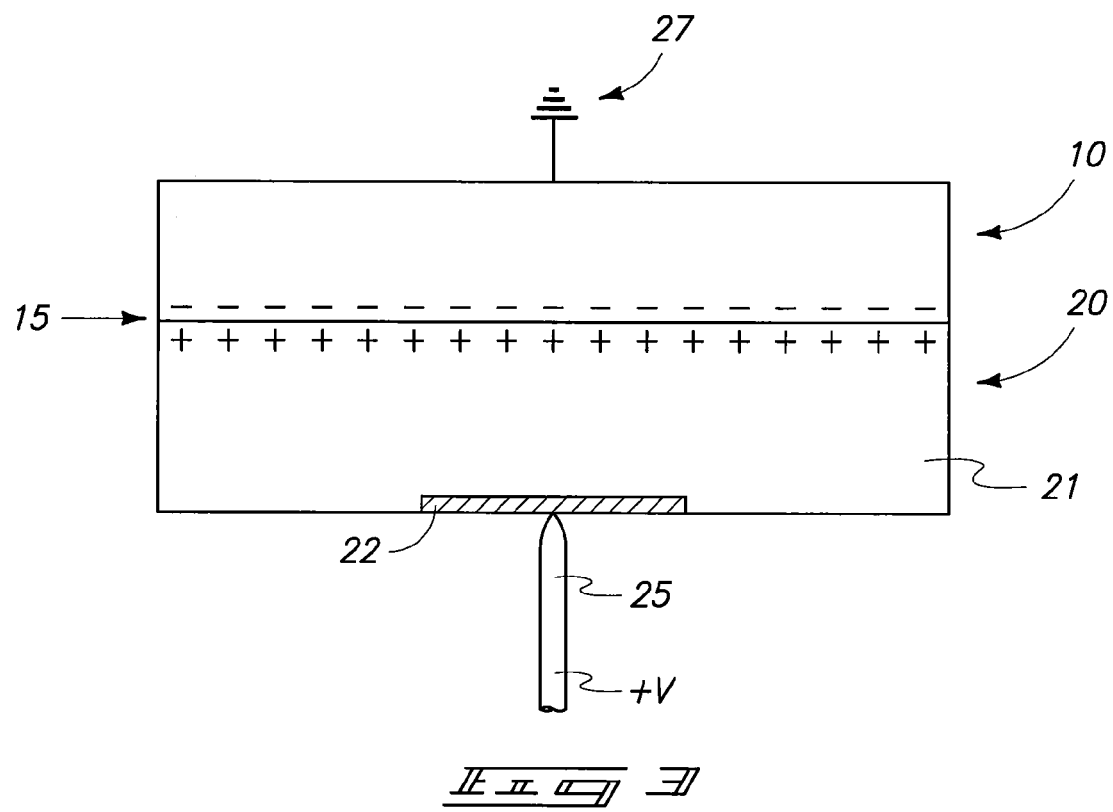
FIG. 3 is a view of the FIG. 2 assembly at a step subsequent to that depicted by FIG. 2.

Embodiments of the invention include methods of processing substrates, electrostatic carriers for retaining a substrate for processing independent of method, and assemblies including electrostatic carriers and substrates electrostatically bonded thereto independent of method.

Certain embodiments of methods of processing a substrate are initially described with reference to FIGS. 1-7. Referring initially to FIGS. 1 and 2, a substrate to be processed is indicated generally with reference numeral 10 and an electrostatic carrier is indicated generally with reference numeral 20. In one embodiment, substrate 10 comprises a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Electrostatic carrier 20 is depicted as diagrammatically comprising some suitable carrier substrate 21 having an exposed conductive electrode 22. Additional electrodes and circuitry might be associated with electrostatic carrier 20 for creating an electrostatic charge as will be appreciated by the artisan. Further and accordingly, aspects disclosed herein apply to existing and yet-to-be developed electrostatic carriers and substrates. FIG. 1 depicts substrate 10 and electrostatic carrier 20 separate and in proximity relative one another, whereas FIG. 2 discloses such in an example contacting relationship at or forming an interface 15 in preparation for suitable electrostatic interconnection/bonding.

Referring to FIG. 3, exposed conductive electrode 22 of electrostatic carrier 20 has been physically contacted with a conductor 25 to electrostatically bond substrate 10 to electrostatic carrier 20. Multiple conductors 25 (not shown) might be used with multiple conductive electrodes (not shown) on electrostatic carrier 20, or only a single conductor 25 might be used in connection with a single conductive electrode of electrostatic carrier 20 (as shown). Regardless and by way of example only, the embodiment of FIG. 3 depicts application of a suitable positive voltage from conductor 25 to electrostatic carrier 20 through exposed conductor 22 while the back-side of substrate 10 is provided at a ground potential 27. Thus, a suitable positive/negative electrostatic attraction force is provided at interface 15 of substrate 10 with electrostatic carrier 20.

Substrate 10 may be treated prior to electrostatic bonding with electrostatic carrier 20 either for some fabrication aspect associated with forming integrated circuitry and/or to facilitate electrostatic bonding. For example and by way of example only, substrate 10 might be subjected to suitable treating to dry it for electrostatic bonding, for example including a bake at elevated temperature or cleaning with a suitable desiccant or solvent.

Figure 4:
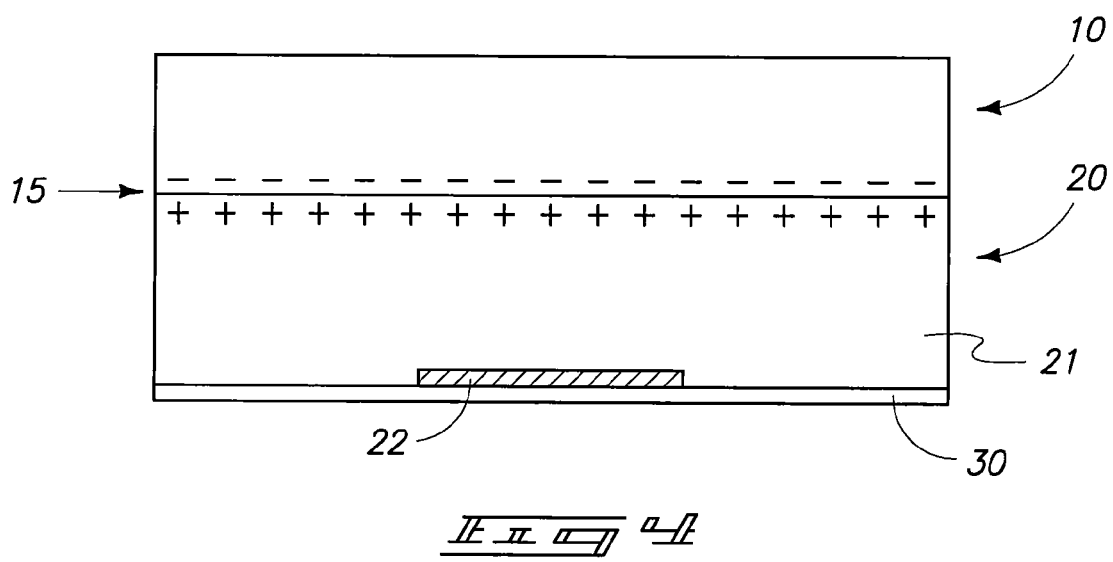
FIG. 4 is a view of the FIG. 3 assembly at a step subsequent to that depicted by FIG. 3.

Referring to FIG. 4, conductor 25 (not shown) has been removed from physically contacting exposed conductive electrode 22. Further, dielectric material 30 has subsequently been applied over conductive electrode 22. In one embodiment, dielectric material completely covers conductive electrode 22 (as shown). In one embodiment, dielectric material 30 is at least 0.1 micron thick and in another embodiment at least 0.5 micron thick, although lower thicknesses might also be used. In one embodiment, an upper thickness is 700 microns, although greater thicknesses might also be used. Dielectric material 30 might comprise one or more different dielectric materials, and regardless might be homogenous, non-homogenous, and/or comprise multiple different layers or regions not all of which are necessarily dielectric. Regardless, dielectric material 30 ideally provides an effective electrically insulating shield over conductive electrode 22 relative to any non-penetrating material that comes into contact with the outer surface of dielectric material 30. Dielectric material 30 may cover an entirety of the back-side of electrostatic carrier 20, or may only cover a portion thereof while being received over conductive electrode 22.

In one embodiment, dielectric material 30 comprises, consists essentially of, or consists of a polymer. In one embodiment, dielectric material 30 comprises, consists essentially of, or consists of one or more of photoresist and polyimide. Dielectric material 30 may be deposited by any existing or yet-to-be developed technique, including physical vapor deposition, chemical vapor deposition, atomic layer deposition, liquid spin coating, lamination processes, etc. In one embodiment, dielectric material 30 comprises, consists essentially of, or consists of adhesive tape which has been adhered to conductive electrode 22. By way of example only, one example reduction-to-practice adhesive tape is Kapton™ polyimide available from DuPont Electronic Technologies of Circleville, Ohio. An example reduction-to-practice photoresist is SPR 220-4.5 available from Rohm & Haas Chemicals, Philadelphia, Pa. Other tapes and/or photoresist and/or polymers and/or other dielectric materials are of course contemplated, including additional material described below. Ideally, dielectric material 30 is chemically and otherwise resistant to treating activity to which electrostatically bonded substrate 10 will be subsequently exposed.

In one embodiment, dielectric material 30 is effective to cover conductive electrode 22 sufficiently to preclude electrical shorting of the upper/outer surface of depicted substrate 10 with conductive electrode 22 regardless of the atmosphere or environment within which the electrostatically bonded substrate 10 is exposed.

Figure 5:
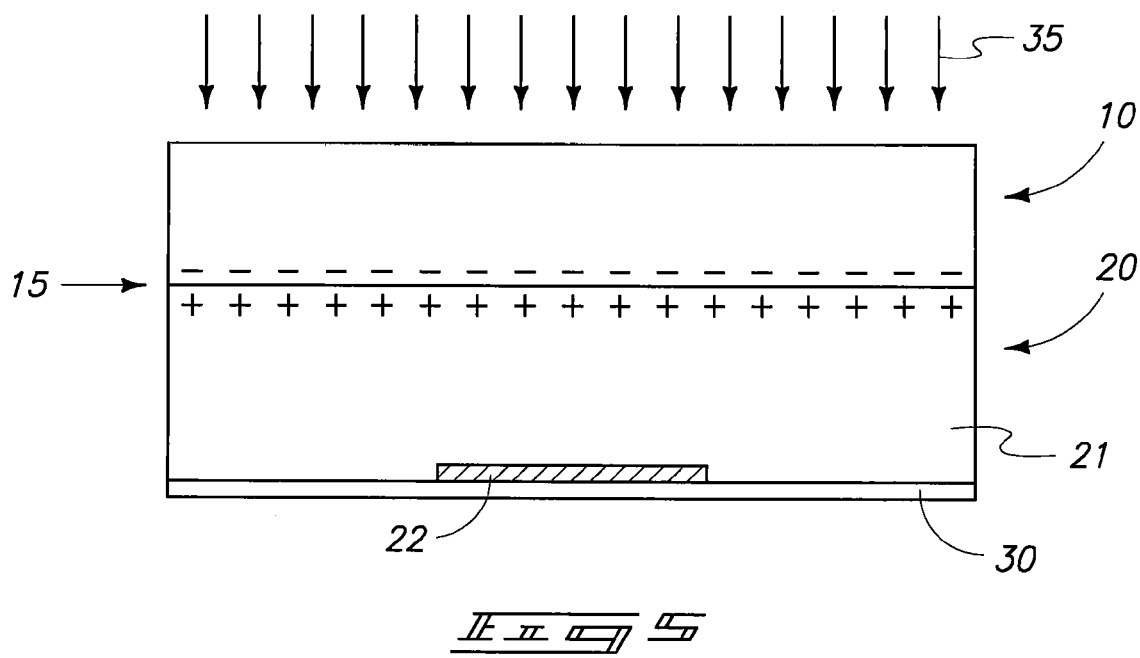
FIG. 5 is a view of the FIG. 4 assembly at a step subsequent to that depicted by FIG. 4.

Referring to FIG. 5, semiconductor substrate 10 while electrostatically bonded with electrostatic carrier 20 is treated in one or more manners, which is diagrammatically indicated by way of example only by downwardly directed arrows 35. Any existing or yet-to-be developed treating is of course contemplated. By way of example only, such might be any of wet processing, dry processing, etching, ion implantation, polishing, grinding, evaporation, annealing, lithography, etc. In but one embodiment, the treating comprises applying a liquid to substrate 10, and in accordance with an aspect which motivated the invention electrostatic carrier 20 with electrostatically bonded substrate 10 is immersed into liquid, for example into a liquid bath for etching, electroplating, cleaning, etc. Of course, substrate 10 as electrostatically bonded to electrostatic carrier 20 might be subjected to a plurality of the same or different treating steps.

Figure 6:
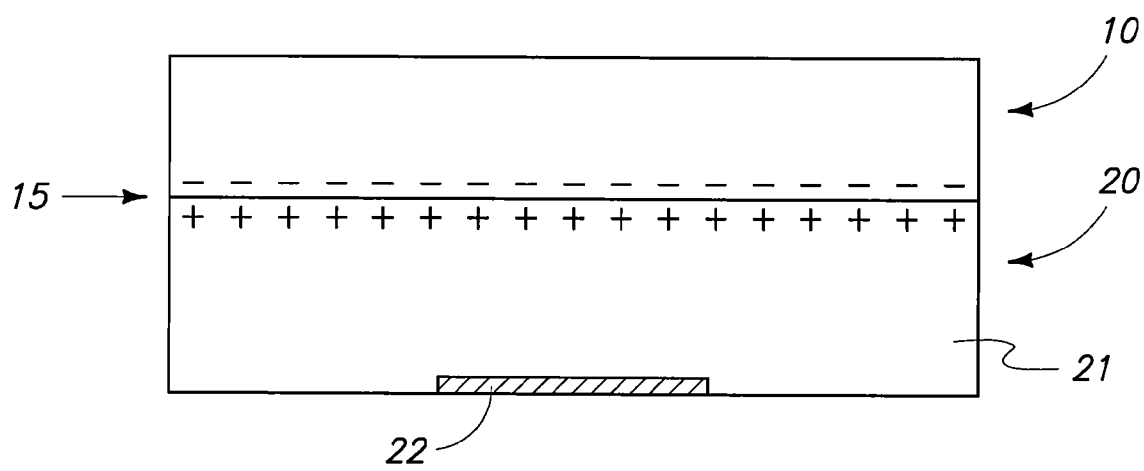
FIG. 6 is a view of the FIG. 5 assembly at a step subsequent to that depicted by FIG. 5.

In one embodiment, dielectric material 30 is at some point removed from over conductive electrode 22 after an act of treating substrate 10, for example as shown in FIG. 6. Removal of dielectric material 30 (not shown) might occur by any suitable process, for example peeling tape away from conductive electrode 22, solvent dissolving of dielectric material 30, wet etching, dry etching, polishing, grinding, etc.

In one embodiment, after removing dielectric material 30 conductive electrode 22 is physically contacted with a suitable conductor to increase electrostatic charge to the electrostatically bonded substrate 10. Such might be conducted, by way of example only, where the electrostatic charge had decreased over time and additional attractive electrostatic charging force was desired, for example for continued treating of substrate 10 as electrostatically bonded to electrostatic carrier 20. By way of example only, such subsequent treating might occur with or without re-covering of conductive electrode 22 with the same or other dielectric material.

Figure 7:
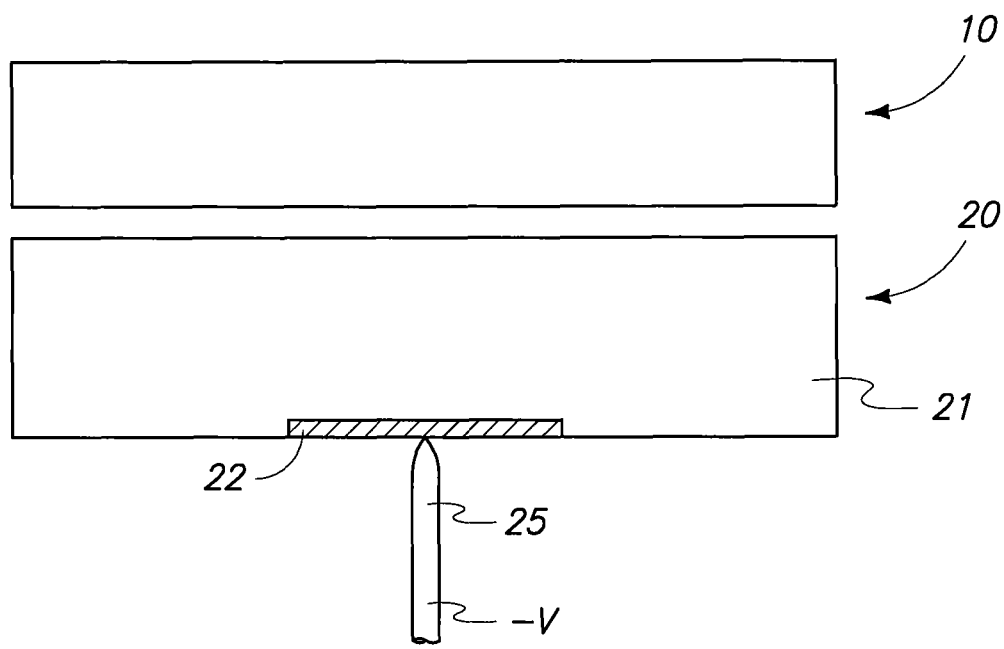
FIG. 7 is a view of the substrate and electrostatic carrier of FIG. 6 in proximity relative to one another at a step subsequent to that depicted by FIG. 6.

Alternately or in addition thereto, and by way of example only, after removing dielectric material 30, conductive electrode 22 can be physically contacted with a conductor effective to de-bond substrate 10 from electrostatic carrier 20, for example as shown in FIG. 7. By way of example only, application of a suitable negative voltage to conductive electrode 22 by a conductor 25 can reduce or eliminate the electrostatic attraction force sufficiently to enable easy separation of substrate 10 from electrostatic carrier 20. Alternately and by way of example only in but one embodiment, conductor 25 for de-bonding might be forced through dielectric material 30, with the dielectric material 30 thereafter perhaps remaining or being removed from electrostatic carrier 20.

Figure 8:
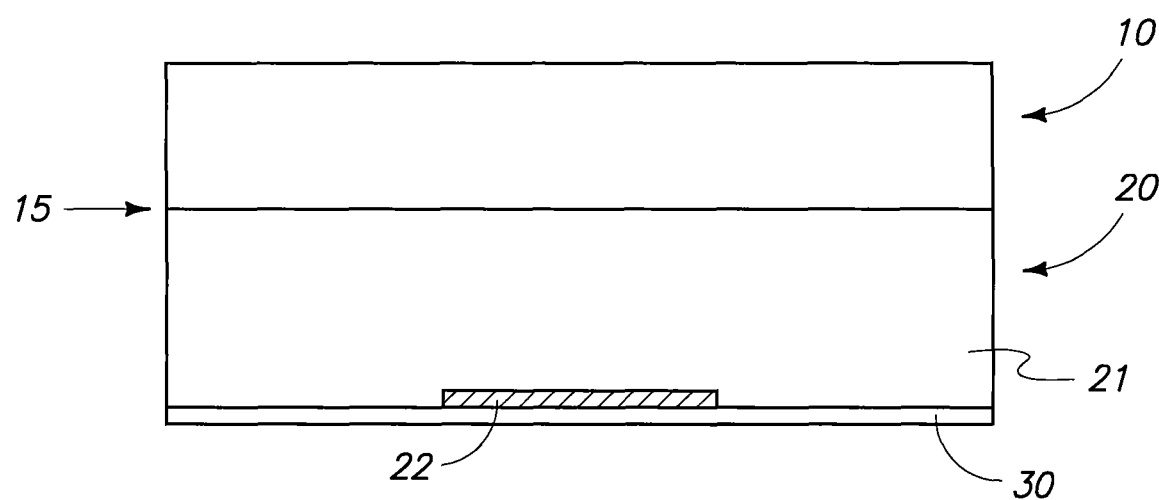
FIG. 8 is a diagrammatic sectional view of a substrate and an electrostatic carrier in contact with one another.

Example additional embodiment methods of processing a substrate are next described with reference to FIGS. 8-12. Like numerals from the first described embodiments are utilized where appropriate, with differences being indicated with small-letter suffixes or with different numerals. FIG. 8 depicts substrate 10 received against electrostatic carrier 20 prior to electrostatic bonding. A dielectric material 30 is provided over conductive electrode 22 prior to such electrostatic bonding. In one embodiment, dielectric material is provided to completely cover conductive electrode 22. Dielectric material 30 in certain embodiments might comprise any of the above-described exemplary dielectric materials 30. Yet in one embodiment, dielectric material 30 is a self-healing material. A self-healing material is a term of art for a material which has an inherent built-in ability to at least partially repair mechanical damage occurring thereto. In one embodiment, an example self-healing dielectric material comprises a parylene. In one embodiment, another example self-healing dielectric material comprises polyimide comprising microencapsulated healing agents, for example polycyclic organic moieties or functionalized derivatives thereof with dicyclopentadiene resins being but one example. Self-healing dielectric materials might also be utilized in connection with the FIGS. 1-7 embodiments described above. Further in certain embodiments in connection with FIG. 8 and subsequent processing, dielectric material 30 might not be self-healing. Also, dielectric material 30 might comprise a combination of self-healing material and material that is not self-healing.

Figure 9:
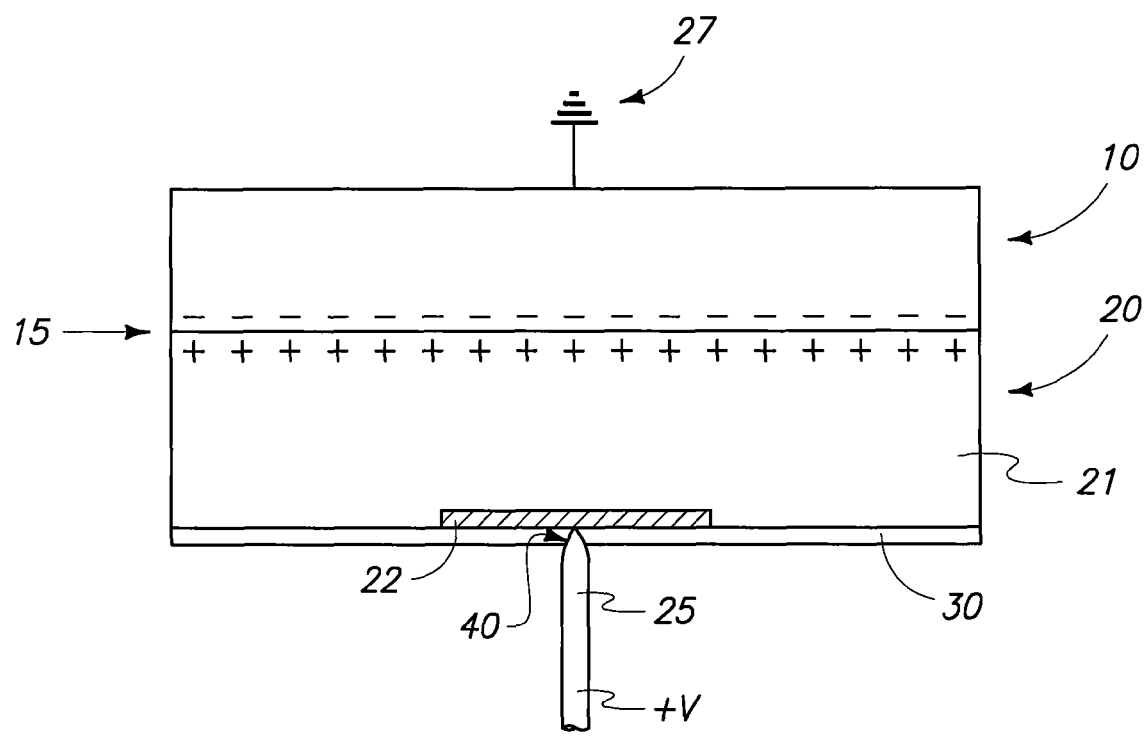
FIG. 9 is a view of the FIG. 8 assembly at a step subsequent to that depicted by FIG. 9.

Referring to FIG. 9, a conductor 25 has been forced through dielectric material 30 to physically contact conductor 25 with conductive electrode 22 to electrostatically bond substrate 10 to electrostatic carrier 20. Accordingly in one embodiment, such forcing of conductor 25 through dielectric material 30 forms a hole 40 therethrough at least while conductor 25 penetrates through dielectric material 30.

Figure 10:
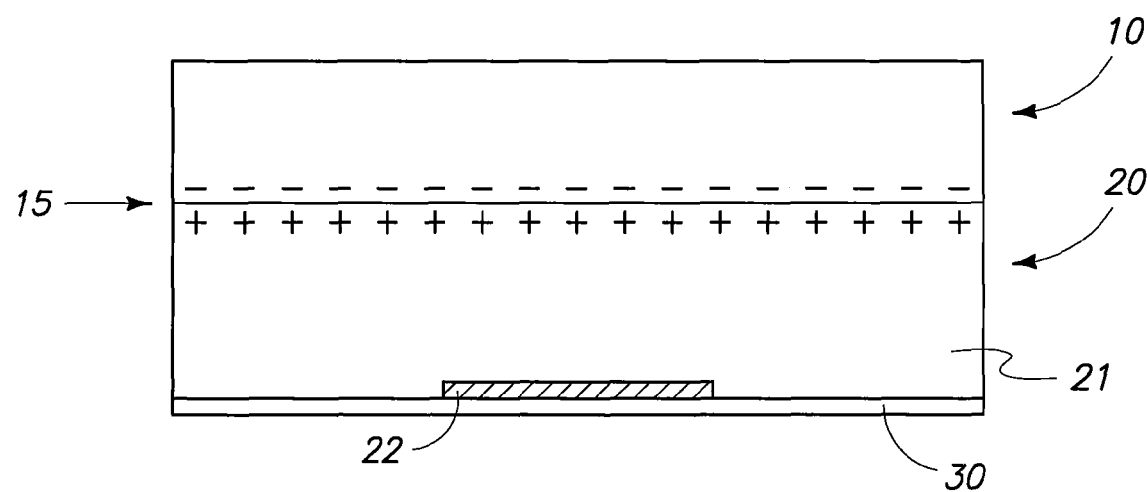
FIG. 10 is a view of the FIG. 9 assembly at a step subsequent to that depicted by FIG. 9.
Figure 11:
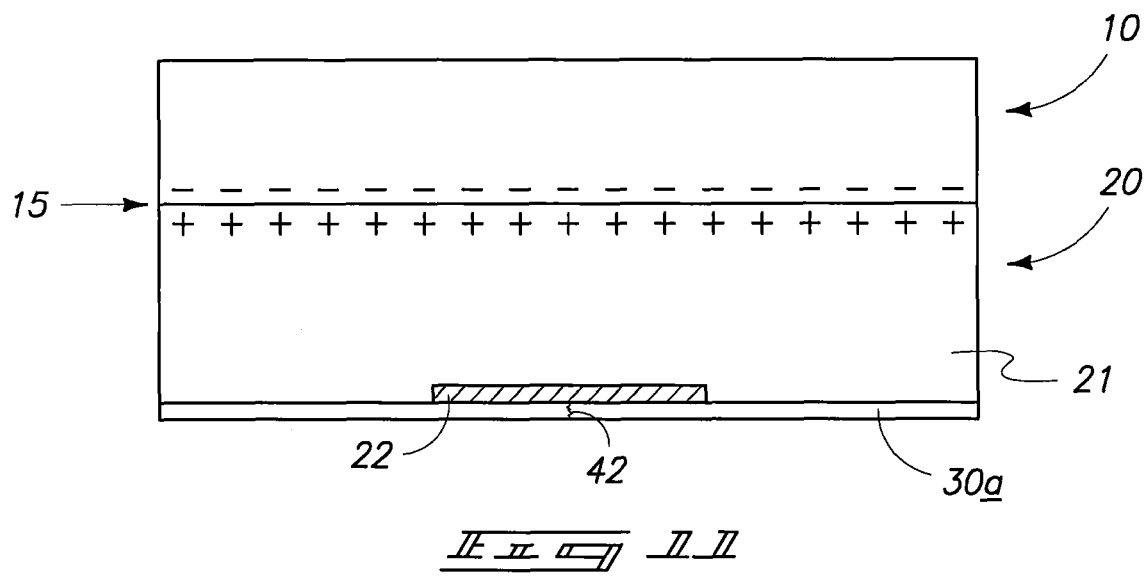
FIG. 11 is a view of the FIG. 9 assembly at an alternate possible step subsequent to that depicted by FIG. 9.

Conductor 25 is removed from dielectric material 30. FIG. 10 depicts one example embodiment wherein dielectric material 30 closes hole 40 (not shown) upon removing of conductor 25 from dielectric material 30, for example as ideally occurs with a self-healing dielectric material. Some evidence of hole 40 may or may not exist after removing conductor 25 from a self-healing material 30. Further and regardless, hole closure might also occur in the absence of use of a self-healing material, for example as shown in FIG. 11. FIG. 11 depicts dielectric material 30a as comprising a suitable elastomeric material, for example rubber, which might close back in on itself after removal of conductor 25, forming a crack 42 which mechanically seals sufficiently tight in one embodiment to preclude passage of liquid or other material therethrough to conductive electrode 22.

Figure 12:
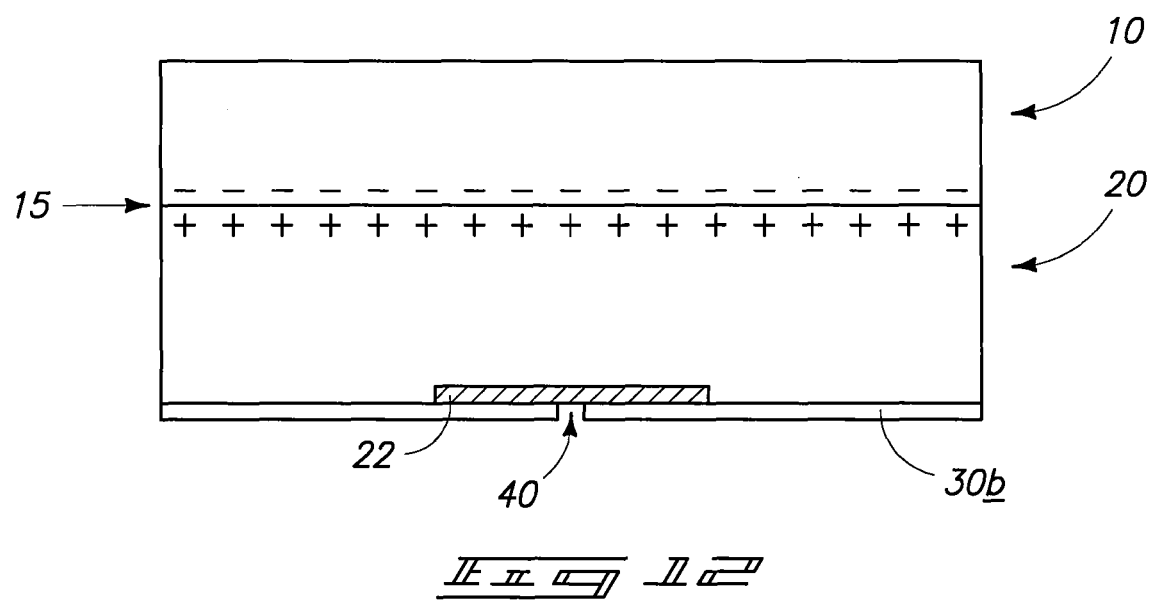
FIG. 12 is a view of the FIG. 9 assembly at another alternate possible step subsequent to that depicted by FIG. 9.

Alternately, at least one embodiment of the invention contemplates the dielectric material not closing the hole upon removing of the conductor, for example as shown in FIG. 12 in connection with a dielectric material 30b. Such depicts hole 40 remaining after removal of conductor 25 (not shown). In such embodiment, remaining hole 40 may or may not preclude passage of material therethrough to conductive electrode 22 during treating of electrostatically bonded substrate 10, or otherwise. In one example, application of a dielectric material over conductive electrode 22 may facilitate time of storage of sufficient electrostatic bonding charge by reducing degree of charge dissipation through conductive electrode 22 (even, for example, if only being exposed to a non-treating room ambient) were it not covered to at least some degree by dielectric material. Regardless, in one embodiment where the forcing of the conductor through dielectric material 30b for the electrostatic charging forms a hole which does not close upon removing of the conductor, the dielectric material is ideally effectively hydrophobic in combination with hole size to preclude contact of an aqueous liquid through the hole to the conductive electrode in spite of the hole not closing. One example suitable hydrophobic dielectric material comprises polytetrafluoroethylene.

Regardless, substrate 10 while electrostatically bonded to electrostatic carrier 20, for example in any of the FIGS. 10-12 embodiments, is treated for example in any manner as described above in connection with the FIG. 5 embodiments. In one particular embodiment, the treating comprises applying an aqueous liquid to substrate 10, including by way of example only immersing electrostatic carrier 20 with electrostatically bonded substrate 10 into one or more aqueous liquids. Regardless, at the conclusion of processing, a de-bonding voltage potential might be applied by again forcing a conductor through the dielectric material 30 to contact conductive electrode 22 in any of the FIGS. 10-12 embodiments.

Further and by way of example only, embodiments of the invention encompass methods of processing a substrate which comprise physically contacting a conductive electrode of an electrostatic carrier with a conductor to electrostatically bond a substrate to the electrostatic carrier. The conductor is removed from physically contacting the conductive electrode, and dielectric material is provided over the conductive electrode. In one embodiment, the dielectric material is provided to completely cover the conductive electrode. Regardless, the dielectric material might be provided over the conductive electrode before the physical contacting for electrostatic bonding (i.e., example embodiments described in connection with FIGS. 8-12) or the dielectric material might be provided over the conductive electrode only after the act of physical contacting to provide the electrostatic bonding (i.e., any of the embodiments described above in connection with FIGS. 1-7).

Embodiments of the invention also encompass electrostatic carriers for retaining a substrate for processing. For example in one such embodiment, such comprises a carrier substrate having a conductive electrode adapted for physical contact with a conductor that applies a voltage effective to generate an electrostatic charge for retaining a substrate to the carrier substrate for processing. The electrostatic carrier in accordance with this example embodiment comprises a self-healing dielectric material which is received over the conductive electrode and through which the conductor is adapted to penetrate, for example as described above in connection with the FIG. 8 embodiment electrostatic carrier 20 independent of substrate 10. Yet, an embodiment of the invention also contemplates an assembly comprising the above described electrostatic carrier having a substrate 10 electrostatically bonded thereto, also as shown by way of example only in FIG. 8.

In another embodiment, an electrostatic carrier for retaining a substrate for processing comprises a carrier substrate having a conductive electrode adapted for physical contact with a conductor that applies a voltage effective to generate an electrostatic charge for retaining a substrate to the carrier substrate for processing. A dielectric adhesive tape is adhered to the conductive electrode, and independent of whether a substrate is electrostatically bonded thereto. Nevertheless, an embodiment of the invention includes an assembly which comprises such an electrostatic carrier with dielectric adhesive tape adhered to the conductive electrode having a substrate electrostatically bonded to the electrostatic carrier. Regardless, in one embodiment, the dielectric adhesive tape completely covers the conductive electrode.

By way of example only in a further embodiment, an electrostatic carrier for retaining a substrate for processing comprises a carrier substrate having a conductive electrode adapted for physical contact with a conductor that applies a voltage effective to generate an electrostatic charge for retaining a substrate to the carrier substrate for processing. At least one of photoresist and polyimide is received over the conductive electrode, and independent of whether a substrate is electrostatically bonded to the electrostatic carrier. Nevertheless, an embodiment of the invention encompasses an assembly comprising such an electrostatic carrier having at least one of photoresist and polyimide received over the conductive electrode and having a substrate electrostatically bonded to the electrostatic carrier. Regardless, in one embodiment, the at least one of polyimide and photoresist completely covers the conductive electrode.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An electrostatic carrier for retaining a substrate for processing, comprising:
    a carrier substrate;
    a conductive electrode on the carrier substrate adapted for physical contact with a conductor that applies a voltage to generate an electrostatic charge for retaining a substrate to the carrier substrate for processing; and
    a dielectric material covering over the conductive electrode and through which the conductor is adapted to penetrate, the dielectric material comprises multiple different layers not all of which are dielectric.

2. The electrostatic carrier of claim 1 wherein the dielectric material completely covers the conductive electrode.

3. The electrostatic carrier of claim 2 wherein the dielectric material completely covers a side of the substrate which comprises the conductive electrode.

4. The electrostatic carrier of claim 1 wherein the dielectric material comprises a thickness of at least 0.1 micron.

5. The electrostatic carrier of claim 1 wherein the dielectric material comprises a thickness of at least 0.5 micron.

6. The electrostatic carrier of claim 1 wherein the dielectric material comprises a thickness of no greater than 700 microns.

7. An electrostatic carrier for retaining a substrate for processing, comprising:
    a carrier substrate;
    a conductive electrode on the carrier substrate adapted for physical contact with a conductor that applies a voltage to generate an electrostatic charge for retaining a substrate to the carrier substrate for processing; and
    a dielectric material covering over the conductive electrode and through which the conductor is adapted to penetrate, the dielectric material comprises multiple different regions not all of which are dielectric.

8. The electrostatic carrier of claim 7 wherein the dielectric material completely covers the conductive electrode.

9. The electrostatic carrier of claim 8 wherein the dielectric material completely covers a side of the substrate which comprises the conductive electrode.

10. The electrostatic carrier of claim 7 wherein the dielectric material comprises a thickness of at least 0.1 micron.

11. The electrostatic carrier of claim 7 wherein the dielectric material comprises a thickness of at least 0.5 micron.

12. The electrostatic carrier of claim 7 wherein the dielectric material comprises a thickness of no greater than 700 microns.

13. An electrostatic carrier for retaining a substrate for processing, comprising:
    a carrier substrate;
    a conductive electrode on the carrier substrate adapted for physical contact with a conductor that applies a voltage to generate an electrostatic charge for retaining a substrate to the carrier substrate for processing; and
    a dielectric material covering over the conductive electrode and through which the conductor is adapted to penetrate, the dielectric material being hydrophobic and having a hole extending there-through which outwardly exposes the conductive electrode.

14. The carrier of claim 13 wherein the dielectric material is effectively hydrophobic in combination with size of the hole to preclude aqueous liquid from passing through the hole to contact the exposed conductive electrode.

15. The electrostatic carrier of claim 13 wherein the dielectric material comprises multiple different layers not all of which are dielectric.

16. The electrostatic carrier of claim 13 wherein the dielectric material comprises multiple different regions not all of which are dielectric.

* * * * *

UNITED STATES PATENT AND TRADEMARK OFFICE
CERTIFICATE OF CORRECTION

PATENT NO. : 8,929,052 B2  
APPLICATION NO. : 13/921022  
DATED : January 6, 2015  
INVENTOR(S) : Dewali Ray et al.

Page 1 of 1

It is certified that error appears in the above-identified patent and that said Letters Patent is hereby corrected as shown below:

In the Specification

In column 1, line 17, delete "Subsrates" and insert -- Substrates --, therefor.

In column 1, line 17, delete "Therto"," and insert -- Thereto", --, therefor.

In column 1, line 18, delete "And" and insert -- and --, therefor.

In column 1, lines 23-24, delete "electrostatic" and insert -- Electrostatic --, therefor.

In column 1, line 27, delete "refrence." and insert -- reference. --, therefor.

Signed and Sealed this
Twenty-fourth Day of March, 2015

Michelle K. Lee
*Director of the United States Patent and Trademark Office*